United States Patent
Mendel et al.

(10) Patent No.: US 8,572,538 B2
(45) Date of Patent: Oct. 29, 2013

(54) RECONFIGURABLE LOGIC BLOCK

(75) Inventors: David W. Mendel, Sunnyvale, CA (US); Gary Lai, Palo Alto, CA (US); Lu Zhou, Santa Clara, CA (US); Bruce B. Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/369,226

(22) Filed: Feb. 8, 2012

(65) Prior Publication Data
US 2013/0007679 A1 Jan. 3, 2013

Related U.S. Application Data

(60) Provisional application No. 61/504,115, filed on Jul. 1, 2011.

(51) Int. Cl.
G06F 17/50 (2006.01)
H03K 19/173 (2006.01)

(52) U.S. Cl.
USPC ............................................. 716/117; 326/38

(58) Field of Classification Search
USPC ............................................. 716/117; 326/38
See application file for complete search history.

(56) References Cited

U.S. PATENT DOCUMENTS

2011/0060546 A1* 3/2011 Miller et al. ................. 702/120

* cited by examiner

*Primary Examiner* — Vuthe Siek
(74) *Attorney, Agent, or Firm* — Weaver Austin Villeneuve & Sampson LLP (57) ABSTRACT

A programmable logic device includes logic blocks such as a logic array blocks (LAB) that can be configured as a random access memory (RAM) or as a lookup table (LUT). A mode flag is provided to indicate the mode of operation of configuration logic such as a configuration RAM (CRAM) used during partial reconfiguration of a logic block. An enable read flag is provided to indicate if values stored in the configuration logic are to be read out or a known state is to be read out during a data verification process. Thus, exclusion and inclusion of portions of a region of configuration logic from data verification and correction processes allow a region of configuration logic to store both a design state and a user defined state. Moreover, the region of configuration logic may be dynamically reconfigured from one state to another without causing verification errors.

22 Claims, 6 Drawing Sheets

RECONFIGURABLE LOGIC BLOCK

PRIORITY AND RELATED APPLICATION DATA

This application claims priority and benefit to commonly assigned U.S. Provisional Patent Application No. 61/504,115, titled RECONFIGURABLE LOGIC BLOCK, by David Mendel, filed on Jul. 1, 2011, which is hereby incorporated by reference in its entirety and for all purposes.

TECHNICAL FIELD

The present disclosure generally relates to integrated circuits. More specifically, the present disclosure relates to techniques and systems for implementing an integrated circuit.

DESCRIPTION OF RELATED ART

A Programmable Logic Device (PLD) is a semiconductor integrated circuit that contains fixed logic circuitry that can be programmed to perform a host of logic functions. In a typical scenario, a logic designer uses computer-aided design (CAD) tools to design a custom logic circuit. These tools use information on the hardware capabilities of a given programmable logic device to help the designer implement the custom logic circuit using multiple resources available on that given programmable logic device.

The user may choose to implement a design state in a portion of a PLD. If a design state is implemented, the portion of the PLD may store values indicating a specific design configuration, such as a look-up-table. Alternatively, the user may choose to implement a user defined state in that portion of the PLD. If a user design state is implemented, the PLD may operate as user RAM. Conventional PLD's are limited in their ability to store both a design state and a user defined state concurrently when the ability to verify or correct potential errors in the configuration is desired. Conventional PLD's are also limited in their ability to be reconfigured from one state to another while the PLD remains operational. Consequently, users are limited in their ability to implement logic circuits in programmable logic devices.

SUMMARY

A device, such as a programmable logic device (PLD), comprises a logic block, wherein the logic block includes a plurality of logic elements. The device may further include configuration logic associated with the logic block, wherein configuration logic stores values for the plurality of logic elements included in the logic block. The device may also include a first memory cell storing a mode flag, wherein the mode flag identifies whether the configuration logic stores a user defined state or a design state, wherein the configuration logic is excluded from a data verification and correction process in response to storing a user defined state, and wherein the configuration logic is included in the data verification and correction processes in response to storing a design state. The device may further include a second memory cell storing an enable read flag, wherein the enable read flag identifies whether values stored in the configuration logic are to be read out or whether a known state is to be read out during the data verification and correction process.

In various embodiments, excluding the configuration logic from the data verification and correction process prevents the data verification and correction process from modifying the configuration logic. In particular embodiments, the mode flag or enable read flag is positioned to reduce the time between correction of an error in the mode flag or enable read flag and the modification of the configuration logic associated with the mode flag or enable read flag. According to various embodiments, the logic block operates as user-defined random access memory or a shift register in response to the configuration logic storing a user defined state. In particular embodiments, the mode flag or enable read flag comprises a single bit of data. According to various embodiments, the mode flag or enable read flag is protected by triple modular redundancy, larger gate area, protective capacitors, or the use of increased voltage. In particular embodiments, the logic block is a field programmable gate array (FPGA) block, and wherein the memory cell is a random access memory cell, a latch, or a register. According to various embodiments, the mode flag and enable read flag are associated with configuration logic for more than one logic block.

In another aspect, the device may comprise a plurality of logic blocks, wherein each logic block of the plurality of logic blocks includes a plurality of logic elements. The device may further comprise configuration logic associated with at least one logic block of the plurality of logic blocks, wherein the configuration logic identifies the values stored in a plurality of logic elements included in the at least one logic block of the plurality of logic blocks, and wherein the configuration logic is stored within a configuration random access memory (CRAM) cell array including a plurality of columns of CRAM cells. The configuration logic may include a first memory cell storing a mode flag, wherein the mode flag identifies whether the configuration logic stores a user defined state or a design state, wherein the configuration logic is excluded from a data verification and correction process in response to storing a user defined state, and wherein the configuration logic is included in the data verification and correction processes in response to storing a design state. The configuration logic may also include a second memory cell storing an enable read flag, wherein the enable read flag identifies whether values stored in the configuration logic block are to be read out or whether a known state is to be read out during the data verification and correction process.

In various embodiments, the configuration logic occupies more than one column of CRAM cells in the CRAM cell array. In particular embodiments, the mode flag and enable read flag are associated with more than one logic block. According to various embodiments, a logic block operates as user-defined random access memory or a shift register in response to the configuration logic storing a user defined state. In particular embodiments, the mode flag or enable read flag is protected by triple modular redundancy, larger gate area, protective capacitors, or the use of increased voltage. According to various embodiments, the configuration logic is stored in a column of CRAM other than the column of CRAM storing the mode flag and enable read flag associated with the configuration logic.

In another aspect, the device may include a logic block, wherein the logic block includes a plurality of logic elements, and configuration logic associated with the logic block, wherein the configuration logic stores values identifying values stored in the plurality of logic elements included in the logic block. The device may further include a first memory cell and a second memory cell encoded according to an encoding scheme, wherein the encoding scheme identifies a mode flag and an enable read flag. In various embodiments, the mode flag identifies whether the configuration logic stores a user defined state or a design state, wherein the configuration logic is excluded from a data verification and correction process in response to storing a user defined state, and wherein the configuration logic is included in the data verification and correction processes in response to storing a design state. In particular embodiments, the enable read flag identifies whether values stored in the configuration logic are to be read out or whether a known state is to be read out during the data verification and correction process.

In various embodiments, the mode flag identifies a look-up-table (LUT) mode in response to the first and second memory cell storing a first value. In various embodiments, the first value may be identified by values of 1 and 0, values of 0 and 1, or values of 0 and 0 being stored in the first and second memory cells respectively. The mode flag may also identify a random access memory (RAM) mode in response to the first and second memory cell storing a second value. In various embodiments, the second value may be identified by values of 1 and 1 being stored in the first and second memory cells respectively. The enable read flag may determine that a known state is to be read out in response to the first and second memory cell storing a third value. In various embodiments, the third value may be identified by values of 1 and 0, values of 0 and 1, or values of 0 and 0 being stored in the first and second memory cells respectively. The enable read flag may also determine that values stored in the configuration logic are to be read out in response to the first and second memory cell storing a fourth value. In various embodiments, the fourth value may be identified by values of 0 and 0 being stored in the first and second memory cells respectively.

According to various embodiments, the first memory cell may be positioned on a first side of the configuration logic and the second memory cell may be positioned on a second side of the configuration logic. In some embodiments, the first side may be opposite the second side. For example, the first memory cell may be positioned on the left side of the configuration logic while the second memory cell may be positioned on the right side of the configuration logic. Positioning the first and second memory cells in this way allows a left-to-right or right-to-left setting of values to switch the logic block between a LUT mode and a RAM mode. In particular embodiments, excluding the configuration logic from the data verification and correction process prevents the data verification and correction process from modifying the configuration logic. In various embodiments, the first memory cell and second memory cell are protected by triple modular redundancy, larger gate area, protective capacitors, or the use of increased voltage.

DESCRIPTION OF PARTICULAR EMBODIMENTS

Reference will now be made in detail to embodiments of the present invention contemplated by the inventors for carrying out the invention. Examples of these embodiments are illustrated in the accompanying drawings. While the invention is described in conjunction with these embodiments, it will be understood that the invention is not intended to be limited to the described embodiments. On the contrary, the invention is intended to cover alternatives, modifications, and equivalents as may be included within the spirit and scope of the invention as defined by the appended claims.

For example, the techniques and mechanisms of the present invention will be described in the context of particular types of devices. However, it should be noted that the techniques and mechanisms of the present invention apply to a variety of different types of devices. In the following description, numerous specific details are set forth in order to provide a thorough understanding of the present invention. Particular exemplary embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that various embodiments include multiple iterations of a technique or multiple instantiations of a mechanism unless noted otherwise. For example, a system uses a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

In various embodiments, partial reconfiguration is a process in which various logic blocks, such as a logic array blocks, included in a programmable logic device (PLD) may be reconfigured to execute new functionality, while other logic blocks included in the PLD continue executing existing functionality. Partial reconfiguration may involve periodic verification and correction of values stored in configuration logic, such as configuration random access memory (CRAM), that may store configuration data associated with a logic block included in the PLD. The values stored in the configuration logic may be read out to an error correction block. The error correction block may compute a verification code based on the values stored in the configuration logic. The verification code may be a hash function such as a cyclic redundancy check (CRC), a Forward Error Correction code (FEC) such as a Turbo code or any other function used to compute a verification code.

Later in the verification process, the error correction block may verify the values stored in the configuration logic to determine whether or not the values include errors that should be corrected. The error correction block may read the values stored in the configuration logic and compute an error check value based on the values. The error correction block may compare the previously computed verification code to the error check value. If the error check value and the verification code do not match, the error correction block may determine that an error is present in the configuration logic. If an error, such as a single event upset (SEU) event, is present, it may be possible to modify the configuration logic to correct the error through a conventional error correcting technique associated with the type of verification code used.

Conventional mechanisms for reconfiguring a PLD are limited in their ability to store a design state and a user defined state at the same time. When configuration logic included in the PLD stores a design state, a logic block associated with the configuration logic may operate as a look-up-table (LUT). When storing a design state, the configuration logic may be included in the data verification and correction processes without causing verification errors. However, when the configuration logic stores a user defined state, user modification of values stored in the configuration logic creates inconsistencies between values stored in the configuration logic and the verification code associated with the configuration logic. These inconsistencies cause errors during data verification and correction processes. Accordingly, if detection and correction of errors in a design state are desired, the entire region of configuration logic that includes the design state must store only a design state.

According to various embodiments, a region of configuration logic may store both a design state and a user defined state without causing verification errors. If configuration logic associated with a logic block stores a design state, a mode flag and enable read flag may indicate that the configuration logic is to be included in data verification and correction processes. However, if the configuration logic associated with the logic block stores a user defined state, the mode flag and enable read flag may indicate that a known state is to be read out to the error correction block. Thus, the values stored in the configuration logic associated with the logic block may be included or excluded from data verification and correction processes based on the values stored in the mode flag and enable read flag. Exclusion of the configuration logic associated with a logic block prevents verification errors from occurring, and preserves the user defined state stored in the configuration logic.

Figure 1:
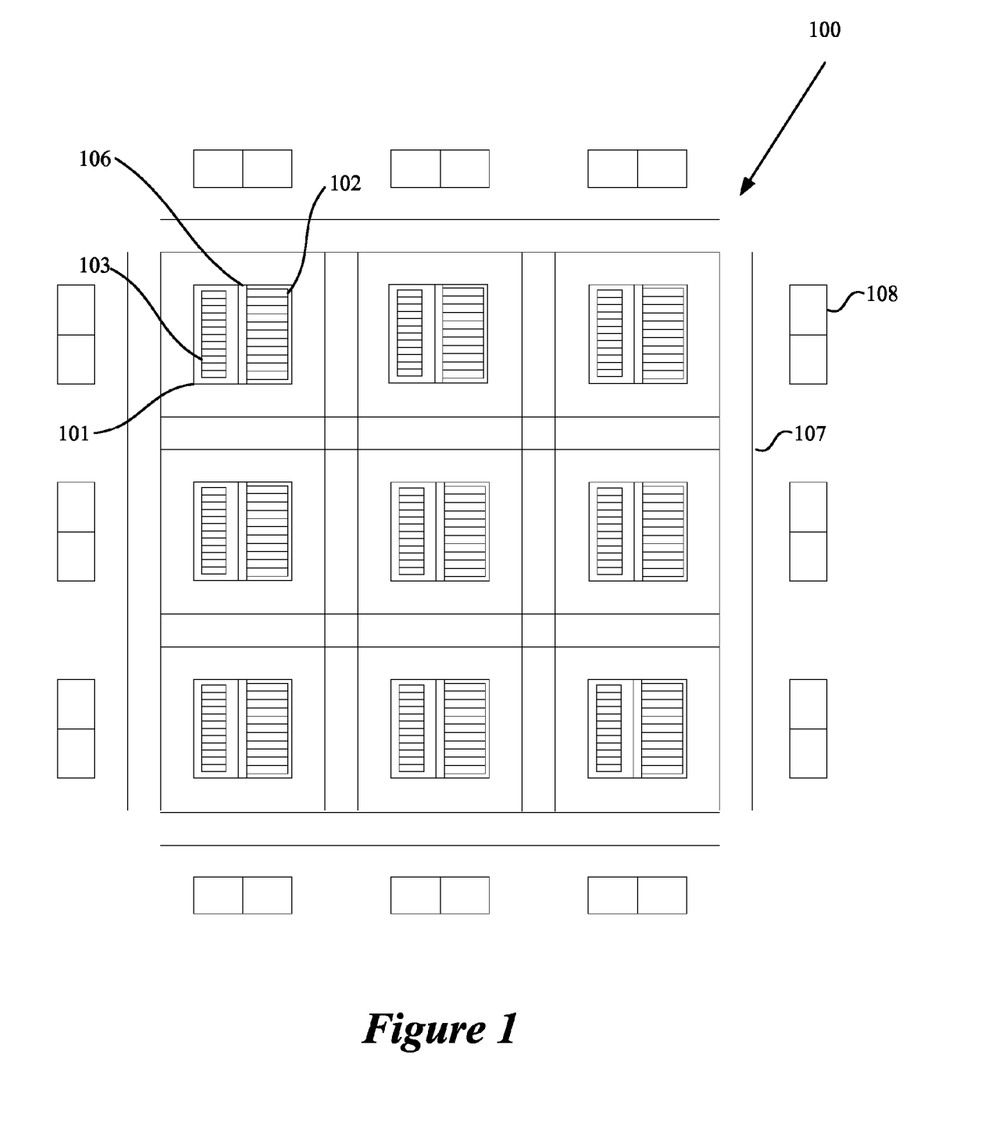
FIG. 1 is an exemplary schematic of a programmable logic device that may be used during partial reconfiguration.

FIG. 1 is an exemplary schematic of a programmable logic device that may be used during partial reconfiguration. According to various embodiments, PLD 100 includes a plurality of logic blocks 101 arranged in rows and columns. Each logic block 101 may include logic elements 102. PLD 100 may further include a plurality of CRAM cells 103 associated with the logic elements 102. Local interconnect 106 may connect logic elements 102 to each other. Local interconnect 106 may be connected to routing interconnect 107. Routing interconnect 107 may be connected to device interface 108.

In various embodiments, CRAM cells 103 associated with logic block 101 within PLD 100 may store a design state, such as a look-up-table (LUT), while other CRAM cells associated with other logic blocks may store a user defined state, such as user RAM. For example, if CRAM cells 103 associated with logic block 101 store a design state, logic block 101 operates as a LUT. The values stored in CRAM cells 103 may identify the values of logic elements 102, which in turn may identify the values of the LUT. Accordingly, logic elements 102 may be configured in any way that uses CRAM to implement a logic function. For example, logic elements 102 may be a LUT, an incomplete LUT, or a programmable CPU. When CRAM cells 103 store a user defined state, logic block 101 may operate as user RAM. Accordingly, the values stored in CRAM cells 103 may control the functionality of logic elements 102, which in turn may control the functionality of logic block 101. PLD 100 may be partially reconfigured by changing the values stored in CRAM cells associated with particular logic blocks while other CRAM cells associated with other logic blocks remain unchanged and continue executing existing functionality according to existing programming.

Figure 2:
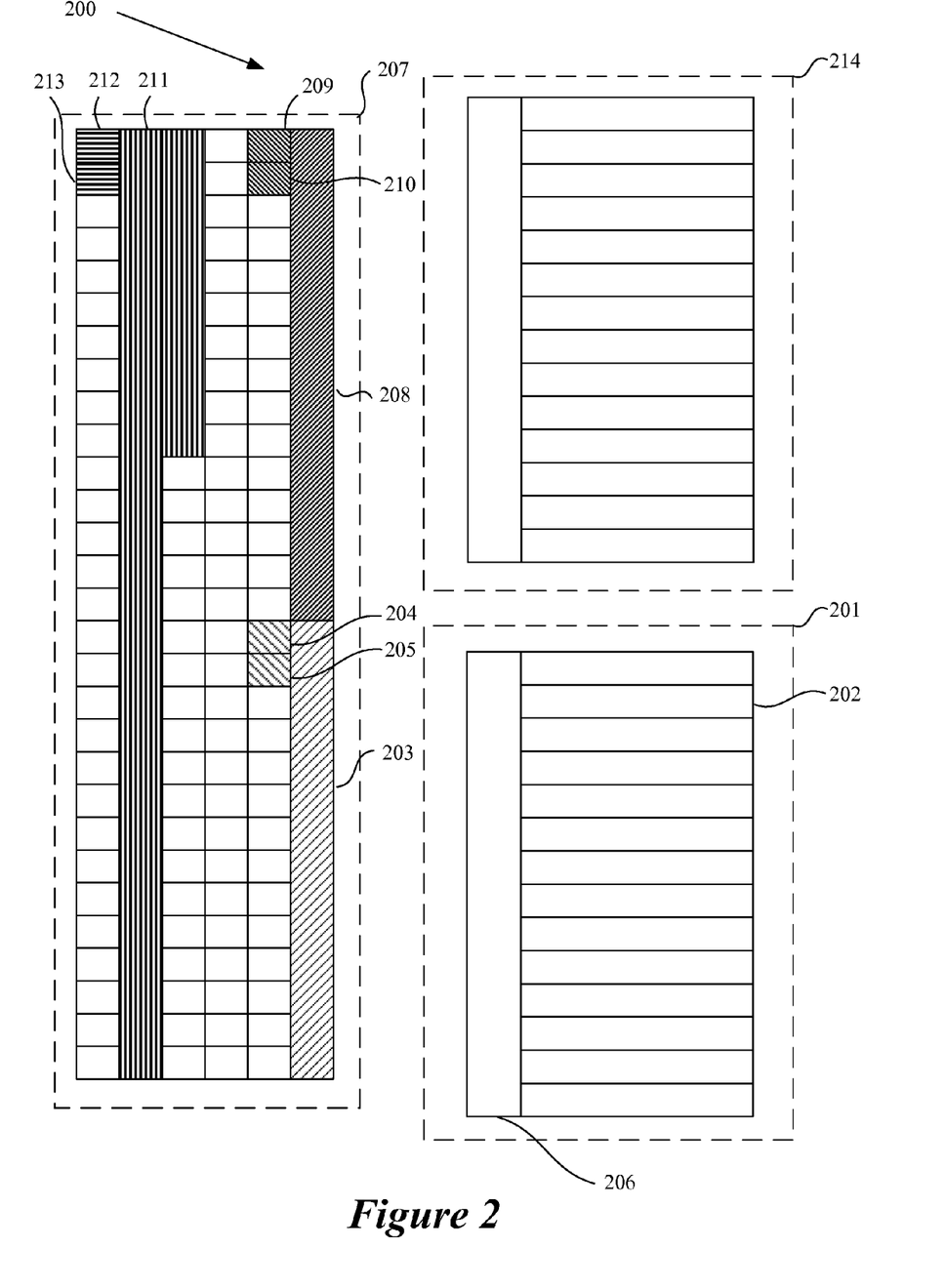
FIG. 2 is an exemplary schematic of configuration random access memory and logic blocks within a programmable logic device in accordance with one embodiment of the present invention.

FIG. 2 is an exemplary schematic of configuration random access memory and logic blocks within a programmable logic device in accordance with one embodiment of the present invention. In various embodiments, logic block 201 may include logic elements 202 which may be arranged as a column of logic elements. Logic block 201 may also include local interconnect 206 which allows logic elements 202 to communicate with each other. CRAM cells 203, mode flag 204, and enable read flag 205 may be included in CRAM cell array 207 and may be associated with logic block 201. CRAM cells 208, mode flag 209, and enable read flag 210 may be included in CRAM cell array 207 and may be associated with logic block 214. Additionally, CRAM cells 211, mode flag 212, and enable read flag 213 may be included within CRAM cell array 207.

In various embodiments, mode flags 204, 209, and 212 indicate whether CRAM cells 203, 208, and 211 each store a design state or a user defined state respectively, and if each group of CRAM cells should be included in or excluded from data verification and correction processes respectively. For example, mode flag 204 may identify when CRAM cells 203 store a design state, or a user defined state. Thus, mode flag 204 may identify when logic block 201 operates as a LUT or as user RAM. In various embodiments, when mode flag 204 indicates that CRAM cells 203 store a design state, CRAM cells 203 are included in data verification and correction processes. Thus, an error correction block may read and modify values stored in CRAM cells 203 when they store a design state. However, when mode flag 204 indicates that CRAM cells 203 store a user defined state, CRAM cells 203 are excluded from data verification and correction processes. Thus, the error correction block may not read or modify values stored in CRAM cells 203 when they store a user defined state. Instead, a known state, such as all zeros, is read out the error correction block, and the error correction block is prevented from writing to CRAM cells 203. A similar process may be applied to mode flags 209 and 212.

In various embodiments, enable read flags 205, 210, and 213 indicate if the values stored in CRAM cells 203, 208, and 211 or a known state should be read out during data verification and correction processes. Unlike mode flags, the values indicated by the enable read flag are independent of whether or not the logic block stores a design state, or a user defined state. If enable read flag 205 indicates that the values stored in CRAM cells 203 should be read out to the error correction block during data verification and correction processes, the actual values may be read out and compared to the verification code corresponding to CRAM cells 203. If enable read flag 205 indicates that a known state, such as all zeros, should be read out during data verification and correction processes, the known state may be read out to the error correction block. Furthermore, when enable read flag 205 indicates that a known state is to be read out, the values stored in CRAM cells 203 may be excluded from data verification and correction processes because the error correction block may not read or modify the values stored in CRAM cells 203. A similar process may be applied to enable read flags 210 and 213.

In various embodiments, a flag may comprise a single bit of data, or alternatively, a plurality of bits. Furthermore, a flag may be associated with configuration logic for a plurality of logic blocks. For example, a mode flag may indicate whether or not 5 logic blocks store a design state or a user defined state. Alternatively, a mode flag may indicate whether a single logic element within a logic block stores a design state or a user defined state. The same may also be true for any other flag, such as an enable read flag.

Furthermore, in particular embodiments, a flag may be positioned to reduce time between scanning and potential correction of the flag and of the CRAM cells associated with the flag during data verification and correction processes. Such positioning reduces the instances of errors, such as a SEU, that may occur after the mode flag has been scanned, but before its associated CRAM cells have been scanned. For example, a mode flag may be placed one column to the left or to the right of the CRAM cells associated with the mode flag.

In various embodiments, CRAM cells 203, 208, and 211 may include values that contain a routing configuration that should always be checked by the data verification and correction process. In this case, the mode flags and enable read flags would only affect what happens to the CRAM cells that are associated with a design state, such as a LUT configuration, or a user defined state during data verification and correction processes. The mode flags and enable read flags would not affect the CRAM cells containing the routing configuration.

In various embodiments, CRAM cell array 207 may include a plurality of rows and columns of CRAM cells comprising all CRAM used by PLD 200. A single column of CRAM cells within CRAM cell array 207 may include CRAM cells associated with more than one logic block within PLD 200. As illustrated in FIG. 2, CRAM cells 203 associated with logic block 201 may be included in the same column of CRAM cells as CRAM cells 208 associated with logic block 214. Furthermore, the CRAM cells associated with a single logic block may occupy more than one column of CRAM cells. For example, CRAM cells 211 may be associated with a single logic block and may occupy more than one column of CRAM cells in CRAM cell array 207.

As shown in FIG. 2, a mode flag or enable read flag may be located in the same or different region of their associated configuration logic. A region of configuration logic may be a column of CRAM cells within CRAM cell array 207. A region of configuration logic may include configuration logic associated with a plurality of logic blocks. For example, mode flag 204 and enable read flag 205 may be located in a separate column of CRAM cells than CRAM cells 203. The same may be true for mode flags 209 and 212 and enable read flags 210 and 213. Furthermore, according to various embodiments, each flag may be located in the same column of CRAM as the configuration logic associated with the flag.

In various embodiments, CRAM cell array 207, or a subset of CRAM cells within CRAM cell array 207, may be protected from errors, such as a single event upset (SEU) due to alpha particles, which may potentially result in a catastrophic error in the operation of PLD 200. For example, mode flags and enable read flags may be protected by hardening techniques such as triple modular redundancy, in which 3 redundant copies of a value are stored and supplied to a voting circuit so that an error in one cell will not affect the value represented by the output of the voting circuit. Other techniques may also be used, such as the use of a higher voltage, larger gate area, protective capacitors, or the use of a 12 transistor cell instead of a 6 transistor cell.

Figure 3:
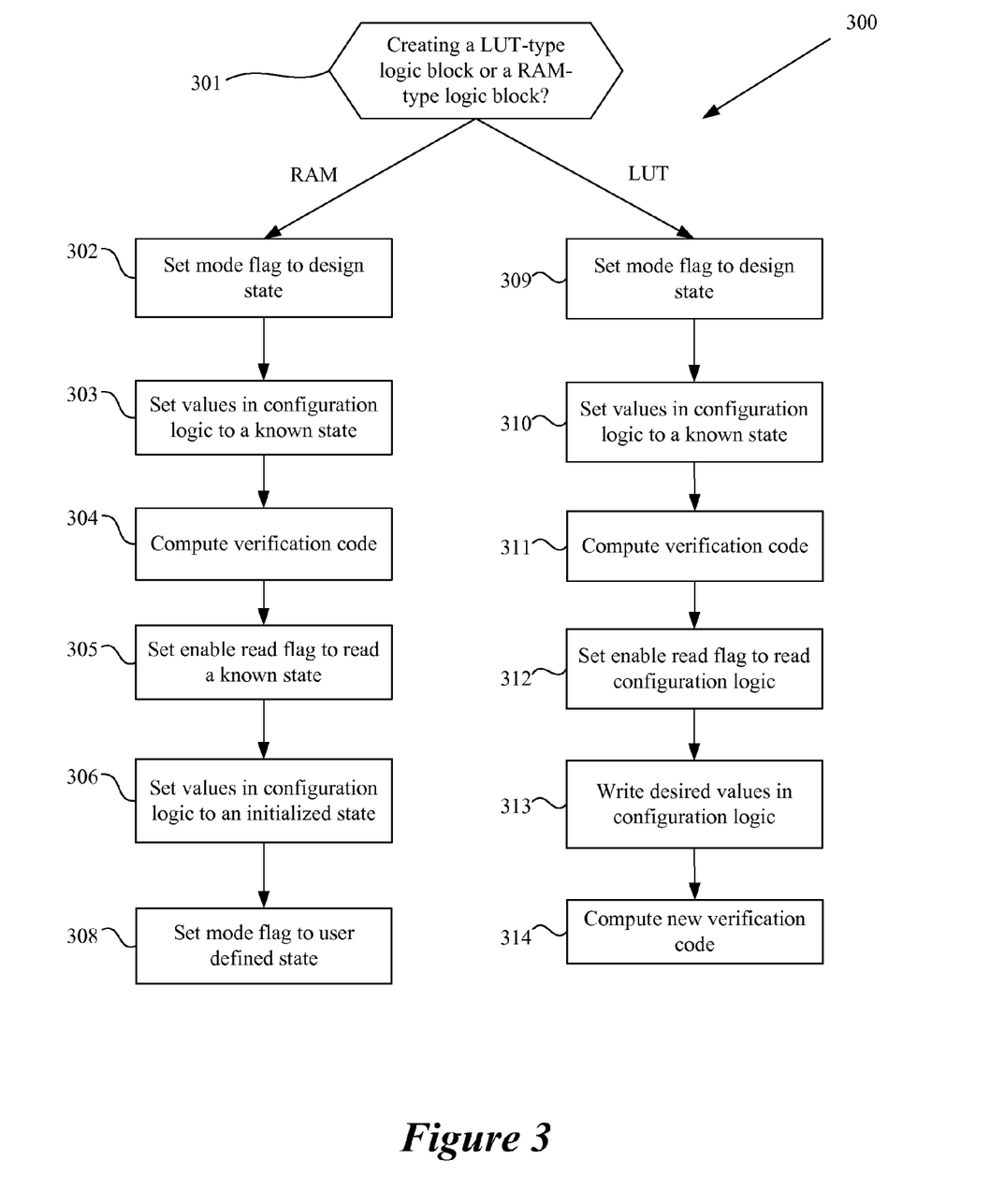
FIG. 3 is an exemplary process of reconfiguration utilizing a mode flag and an enable read flag during dynamic reconfiguration of a logic block in accordance with one embodiment of the present invention.

FIG. 3 is an exemplary process of reconfiguration utilizing a mode flag and an enable read flag during dynamic reconfiguration of a logic block in accordance with one embodiment of the present invention. In process 300, a controller may reconfigure a logic block to a LUT-type logic block that operates as a LUT, or a RAM-type logic block that operates as user RAM. According to various embodiments, reconfiguration to either type of logic block is independent of the initial configuration of the logic block. For example, if the logic block is reconfigured to a LUT-type logic block, reconfiguration may take place regardless of whether the logic block is initially configured as a RAM-type logic block or a LUT-type logic block.

At 301, an external controller may determine if the logic block is to be reconfigured to a LUT-type logic block or a RAM-type logic block. If the logic block is to be reconfigured to a RAM-type logic block, the configuration logic associated with the logic block may be initialized to an initial value so that the user RAM stores an initial value. However, prior to initialization of the configuration logic, the verification code associated with the configuration logic may be set to a known state. Thus, the data verification and correction process uses a verification code based on the known state during comparisons performed while the logic block operates as user RAM. Accordingly, at 302 the mode flag may be set to indicate a design state to enable write access. With write access enabled, at 303, the configuration logic may be set to a known state. At 304, a new verification code corresponding to the known state may be computed.

In various embodiments, at 305, the enable read flag is set to indicate that the values stored in the configuration logic associated with the logic block are to be read out to the error correction block as a known state. Because the values stored in the verification code have been set to the known state at 304, future iterations of data verification and correction processes involve a comparison between the known state indicated by the enable read flag and the known state indicated by the verification code. Thus, subsequent modifications to the values stored in the configuration logic do not affect this comparison, or cause a verification error.

At 306, the mode flag may still indicate a design state, and the configuration logic may be written to. Thus, the values stored in the configuration logic may be set to an initialized state in order to initialize the user RAM to a specified value. At 308, the mode flag may be set to indicate a user defined state, thus reconfiguring the logic block to a RAM-type logic block that operates as user RAM set to an initial value.

If a LUT-type logic block is desired, at 309, the mode flag may be set to indicate a design state. Setting the mode flag to indicate a design state may indicate that the actual values stored in the configuration logic should be read out to the error correction block during data verification and correction processes. If the values stored in the configuration logic are read out, a verification error may occur because a user may have modified values stored in the configuration logic prior to setting the mode flag to indicate a design state. The user-introduced modifications to the configuration logic have not been included in the verification code associated with the configuration logic, and may cause a verification error.

However, in various embodiments, an enable read flag is utilized. The enable read flag may indicate that a known state continues to be read out to the error correction block even after the mode flag is set to indicate a design state. Accordingly, the operation of the enable read flag may be independent of the state stored in the configuration logic and may be independent of the state indicated by the mode flag. Thus, the error correction block may continue reading a known state, after the mode flag is set, to indicate a design state and after the logic block has been switched from a RAM-type logic block to a LUT-type logic block. Accordingly, the enable read flag prevents user-introduced modifications from being read out to the error correction block and causing verification errors when the logic block is reconfigured to a LUT-type logic block.

At 310 the configuration logic may be set to a known state in preparation for subsequent storing of a design state. Accordingly, the configuration logic may be set to all zeros in one instance. Setting the configuration logic to a known state may erase any modifications a user may have made to the values stored in the configuration logic when the logic block was operating as user RAM. At 311, the verification code may be set to a known state by computing a verification code based on the values stored in the configuration logic.

At 312, the enable read flag may be set to indicate that the error correction block may read and write values stored within the configuration logic. Thus, the configuration logic may be included in data verification and correction processes and subsequent changes to the values stored in the configuration logic may be updated in the verification code associated with the configuration logic.

In various embodiments, the LUT-type logic block may be reconfigured to include new design functionality. At 313, the values stored in the configuration logic may be reconfigured to a new design state. For example, the configuration logic may be programmed with a new design state indicating values of a new LUT. At 314, a new verification code corresponding to the new design state may be computed.

TABLE 1

| Cell 1 | Cell 2 | Values read by Error Correction Block | LUT Type/RAM Type Logic Block |
|---|---|---|---|
| 0 | 0 | CRAM values | LUT Type |
| 0 | 1 | 0 | LUT Type |
| 1 | 0 | 0 | LUT Type |
| 1 | 1 | 0 | RAM Type |

Table 1 represents, according to various embodiments, implementation of the functionality of a mode flag and an enable read flag via an exemplary encoding of two values stored in memory cell 1 and memory cell 2. Thus, encoded values stored in the memory cells may indicate when configuration logic associated with a logic block stores a design state and operates as a LUT-type logic block, and when the configuration logic stores a user defined state and operates as a RAM-type logic block. The encoded values may also indicate when values stored in the configuration logic are to be read out to an error correction block and when a known state is to be read out to the error correction block.

For example, when cell 1 and cell 2 both store a zero value indicates that the configuration logic stores a design state and the logic block operates as a LUT-type logic block. Furthermore, the values stored in the configuration logic are read out to the error correction block. In various embodiments, when cell 1 stores a zero and cell 2 stores a one indicate that the configuration logic stores a design state and the logic block is operating as a LUT-type logic block. Moreover, in response to cell 1 storing a zero and cell 2 storing a 1, a known state, such as zeros, may be read out to the error correction block during data verification and correction processes. As table 1 further indicates, the same may also be true when cell 1 stores a one and cell 2 stores a zero. According to various embodiments, cell 1 and cell 2 storing a value of one indicates that the configuration logic stores a user defined state and the logic block operates as a RAM-type logic block. Furthermore, a known state may be read out to the error correction block and the error correction block may be prevented from modifying values stored in the configuration logic.

In particular embodiments, the two cells may be located in a different region of configuration logic than the configuration logic associated with the encoded cells. For example, cell 1 may be located in the column of CRAM immediately to its right containing the configuration logic associated therewith. Further, cell 2 may be located in the column of CRAM immediately to its left containing the configuration logic associated therewith. Thus, a left-to-right scan of a CRAM cell array during data verification and correction processes may accomplish encoding according to table 1. The same may be true for a right-to-left scan.

Figure 4:
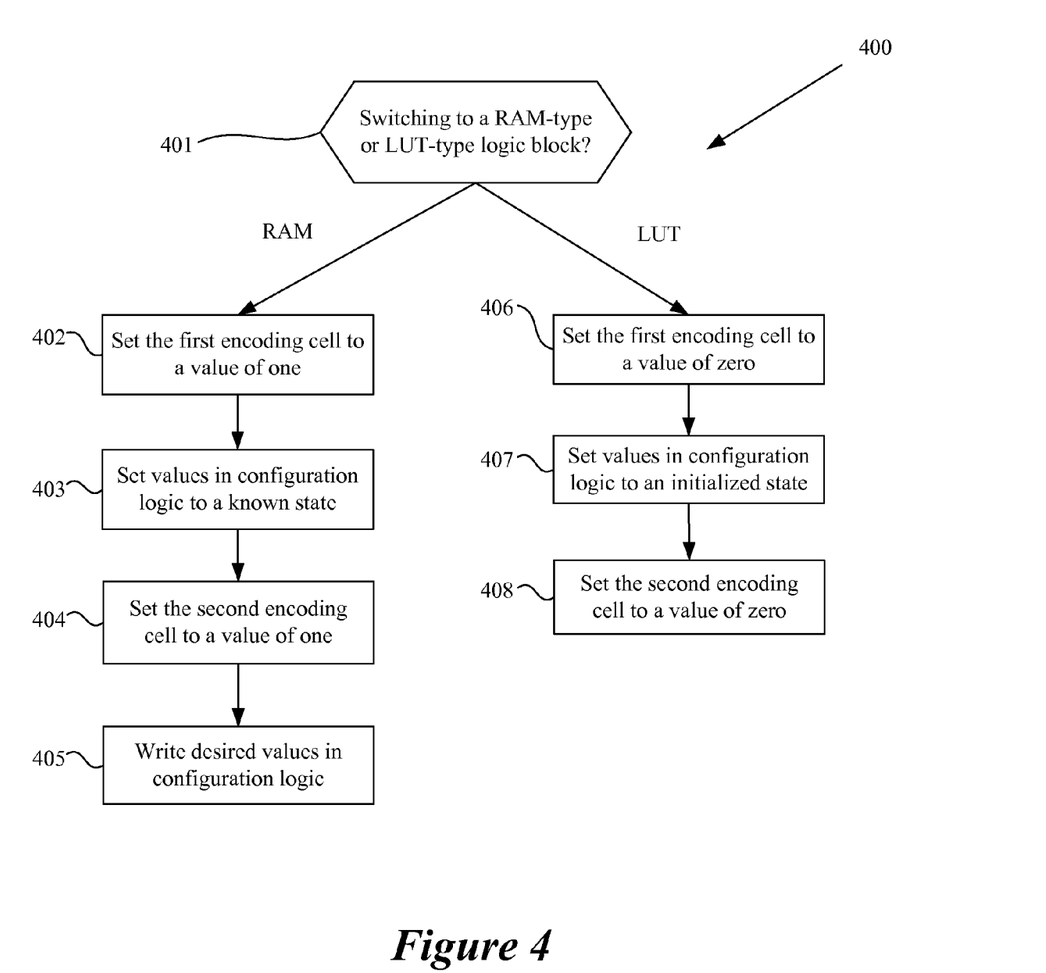
FIG. 4 is an exemplary process of reconfiguration utilizing an encoding scheme during dynamic reconfiguration of a logic block in accordance with one embodiment of the present invention.

FIG. 4 is an exemplary process of reconfiguration utilizing an encoding scheme during dynamic reconfiguration of a logic block in accordance with one embodiment of the present invention. According to process 400, a controller may reconfigure a logic block to either a LUT-type logic block or a RAM-type logic block independent of the initial configuration of the logic block.

According to various embodiments, at 401 an external controller may determine if a logic block is to be reconfigured to a LUT-type logic block or a RAM-type logic block. If the logic block is to be reconfigured to a RAM-type logic block, at 402, cell 1 may be set to store a value of one. When storing a value of one, cell 1 may indicate that the values stored in the configuration logic should be read out to the error correction block as a known state during data verification and correction processes. At 403, the values stored in the configuration logic may be set to an initialized state. At 404, cell 2 may be set to store a value of one. When both cells are set to store a value of one, the cells may indicate that the configuration logic stores a user defined state and the logic block associated with the configuration logic may operate in RAM mode.

If the logic block is to be reconfigured to a LUT-type logic block, at 406, cell 1 associated with the logic block may be set to store a value of zero. A value of zero stored within cell 1 may indicate that the configuration logic stores a design state and the logic block associated with configuration logic is operating in LUT mode. When operating in LUT mode, the logic block may be written to during data verification and correction processes.

According to various embodiments, at 407, the values stored in the configuration logic may be set to a known state, such as all zeros. As previously discussed zeroing out the configuration logic may eliminate modification of the values stored within the configuration logic that may have been introduced by a user. A new verification code may be computed based on the configuration logic. Accordingly, the verification code may be set to a known state.

At 408, cell 2 may be set to store a value of zero. When storing a value of zero, cell 2 may indicate that the error correction block should read the values stored in the configuration logic during data verification and correction processes. Because both the values stored within the configuration logic and the verification code are a known state, inclusion of the configuration logic in data verification and correction processes does not result in a verification error.

Figure 5:
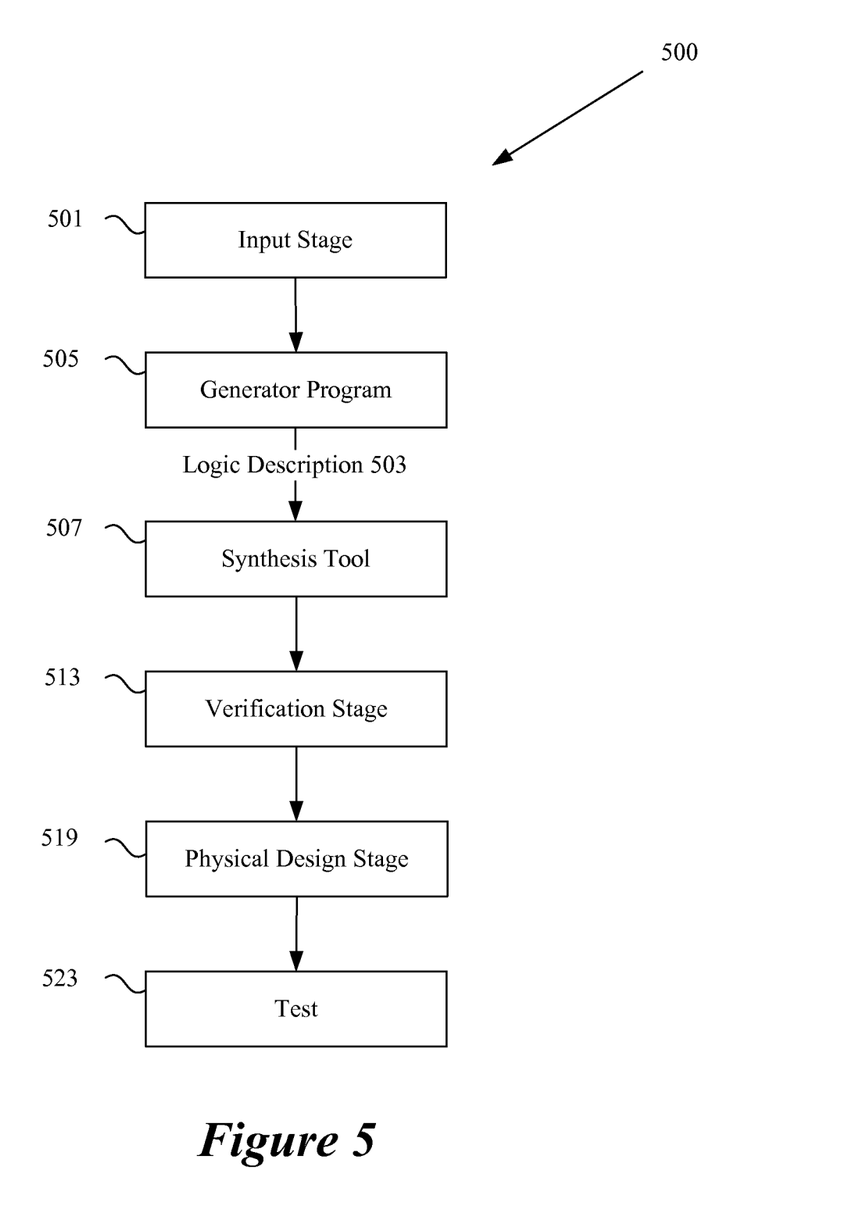
FIG. 5 illustrates an exemplary technique for implementing a programmable chip in accordance with one embodiment of the present invention.

FIG. 5 illustrates an exemplary technique for implementing a programmable chip in accordance with one embodiment of the present invention. An input stage 501 receives selection information typically from a user for logic such as a processor core as well as other components to be implemented on an electronic device. In one example, the input received is in the form of a high-level language program. A generator program 505 creates a logic description and provides the logic description along with other customized logic to any of a variety of synthesis tools, place and route programs, and logic configuration tools to allow a logic description to be implemented on an electronic device.

In one example, an input stage 501 often allows selection and parameterization of components to be used on an electronic device. The input stage 501 also allows configuration of hard coded logic. In particular examples, components provided to an input stage include intellectual property functions, megafunctions, and intellectual property cores. In various embodiments, intellectual property functions, megafunctions, and intellectual property cores may refer to proprietary logic functions, logic blocks, and processor cores that have been previously generated by a third party developer. The input stage 501 may be a graphical user interface using wizards for allowing efficient or convenient entry of information. The input stage may also be a text interface or a program reading a data file such as a spreadsheet, database table, or schematic to acquire selection information. The input stage 501 produces an output containing information about the various modules selected. At this stage, the user may enter security information about individual components that needs to be isolated. For example, different levels of component security and which components are allowed to communicate with each other may be entered.

In typical implementations, the generator program 505 can identify the selections and generate a logic description with information for implementing the various modules. The generator program 505 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 505 identifies pointers and provides ports for each pointer. One tool with generator program capabilities is System on a Programmable Chip (SOPC) Builder available from Altera Corporation of San Jose, Calif. The generator program 505 also provides information to a synthesis tool 507 to allow HDL files to be automatically synthesized. In particular examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 501, generator program 505, and synthesis tool 507 can be separate programs. The interface between the separate programs can be a database file, a log, or simply messages transmitted between the programs. For example, instead of writing a file to storage, the input stage 501 can send messages directly to the generator program 505 to allow the generator program to create a logic description. Similarly, the generator program can provide information directly to the synthesis tool instead of writing HDL files. Similarly, input stage 501, generator program 505, and synthesis tool 507 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 507.

A synthesis tool 507 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 513 typically follows the synthesis stage 507. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 513, the synthesized netlist file can be provided to physical design tools 519 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 523.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 501, the generator program 505, the synthesis tool 507, the verification tools 513, and physical design tools 519 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 6:
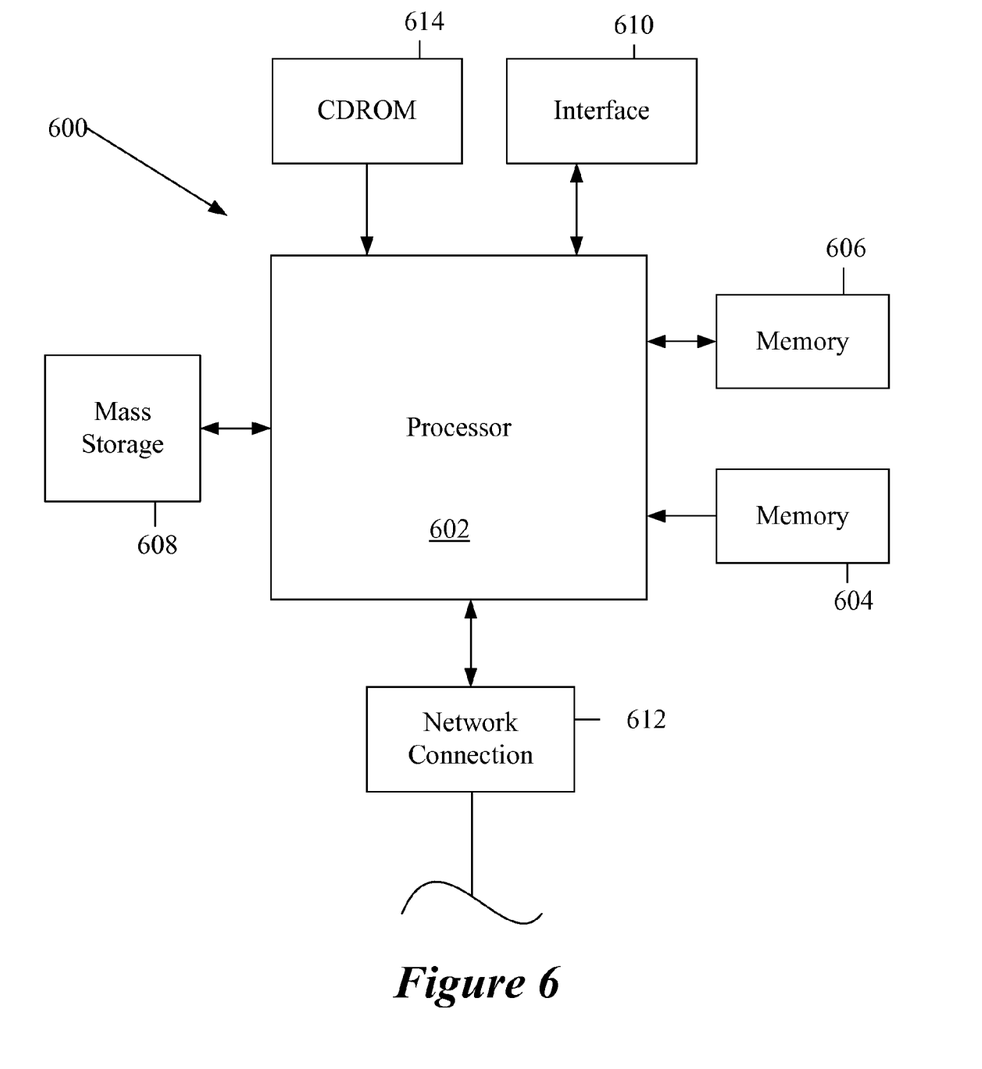
FIG. 6 illustrates one example of a computer system.

FIG. 6 illustrates one example of a computer system. The computer system 600 includes any number of processors 602

(also referred to as central processing units, or CPUs) that are coupled to devices including memory 606 (typically a random access memory, or "RAM"), memory 604 (typically a read only memory, or "ROM"). The processors 602 can be configured to generate an electronic design. As is well known in the art, memory 604 acts to transfer data and instructions uni-directionally to the CPU and memory 606 are used typically to transfer data and instructions in a bi-directional manner.

Both of these memory devices may include any suitable type of the computer-readable media described above. A mass storage device 608 is also coupled bi-directionally to CPU 602 and provides additional data storage capacity and may include any of the computer-readable media described above. The mass storage device 608 may be used to store programs, data and the like and is typically a secondary storage medium such as a hard disk that is slower than memory. The mass storage device 608 can be used to hold a library or database of prepackaged logic or intellectual property functions, as well as information on generating particular configurations. It will be appreciated that the information retained within the mass storage device 608, may, in appropriate cases, be incorporated in standard fashion as part of memory 606 as virtual memory. A specific mass storage device such as a CD-ROM 614 may also pass data uni-directionally to the CPU.

CPU 602 is also coupled to an interface 610 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 602 may be a design tool processor. Finally, CPU 602 optionally may be coupled to a computer or telecommunications network using a network connection as shown generally at 612. With such a network connection, it is contemplated that the CPU might receive information from the network, or might output information to the network in the course of performing the above-described process steps. It should be noted that the system 600 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A device comprising:
a logic block, wherein the logic block includes a plurality of logic elements;
configuration logic associated with the logic block, wherein the configuration logic is operable to identify values stored in the plurality of logic elements;
a first memory cell storing a mode flag value, wherein the mode flag value is operable to identify whether the configuration logic stores a user defined state or a design state, wherein the configuration logic is excluded from a data verification and correction process in response to the configuration logic storing a user defined state, and wherein the configuration logic is included in the data verification and correction process in response to the configuration logic storing a design state; and
a second memory cell storing an enable read flag value, wherein the enable read flag value is operable to identify whether values stored in the configuration logic are to be read out or whether a known state is to be read out during the data verification and correction process, wherein the mode flag value or enable read flag value is implemented using at least one of triple modular redundancy, larger gate area, protective capacitors, or the use of increased voltage.

2. The device of claim 1, wherein excluding the configuration logic from the data verification and correction process prevents the data verification and correction process from modifying the configuration logic.

3. The device of claim 1, wherein the mode flag value or enable read flag value is positioned to reduce the time between a scan of the mode flag value or enable read flag value and a scan of the configuration logic during the data verification and correction process.

4. The device of claim 1, wherein the user defined state has the functionality of a random access memory or a shift register.

5. The device of claim 1, wherein the mode flag value or enable read flag value comprises a single bit of data.

6. The device of claim 1, wherein the mode flag value or enable read flag value is implemented using triple modular redundancy.

7. The device of claim 1, wherein the logic block is a field programmable gate array (FPGA) block, and wherein the memory cell is a random access memory cell, a latch, or a register.

8. The device of claim 1, wherein the mode flag value and enable read flag value are associated with configuration logic for more than one logic block.

9. The device of claim 1, wherein the mode flag value and enable read flag value are located in different regions of the configuration logic.

10. The device of claim 1 further comprising:
a configuration random access memory (CRAM) cell array, wherein the configuration logic, the mode flag value, and the enable read flag value are stored within at least one column of CRAM cells included in the CRAM cell array.

11. The device of claim 10, wherein the configuration logic occupies more than one column of CRAM cells.

12. The device of claim 10, wherein the configuration logic is stored in a different column of CRAM cells than the mode flag value and enable read flag value.

13. A device comprising:
a logic block, wherein the logic block includes a plurality of logic elements;
configuration logic associated with the logic block, wherein the configuration logic is operable to identify values stored in the plurality of logic elements; and
a first memory cell and a second memory cell encoded according to an encoding scheme, wherein the encoding scheme identifies a mode flag value and an enable read flag value, wherein the mode flag value is operable to identify whether the configuration logic stores a user defined state or a design state, wherein the configuration logic is excluded from a data verification and correction process in response to the configuration logic storing a user defined state, and wherein the configuration logic is included in the data verification and correction process in response to the configuration logic storing a design state, wherein the enable read flag value is operable to identify whether values stored in the configuration logic are to be read out or whether a known state is to be read out during the data verification and correction process, and wherein the mode flag value or enable read flag value is implemented using at least one of triple modular redundancy, larger gate area, protective capacitors, or the use of increased voltage.

14. The device of claim 13, wherein the mode flag value identifies a look-up-table (LUT) mode in response to the first and second memory cell storing a first value, or in response to either the first or second memory cell storing a second value, wherein the mode flag value identifies a random access memory (RAM) mode in response to the first and second memory cell storing the second value, wherein the enable read flag value determines that a known state is to be read out in response to either the first or second memory cell storing the second value, and wherein the enable read flag value determines that values stored in the configuration logic are to be read out in response to the first and second memory cell storing values corresponding to the second value.

15. The device of claim 13, wherein the first memory cell is positioned on a first side of the configuration logic, wherein the second memory cell is positioned on a second side of the configuration logic, and wherein the first side is opposite the second side such that a left-to-right or right-to-left setting of values switches the logic block between a look-up-table (LUT) mode and a random access memory (RAM) mode.

16. The device of claim 13, wherein excluding the configuration logic from the data verification and correction process prevents the data verification and correction process from modifying the configuration logic.

17. The device of claim 13, wherein the first memory cell and second memory cell are implemented using triple modular redundancy.

18. A method comprising:
determining, by a controller, whether a logic block is to be configured to store a user defined state or a design state;
in response to determining that the logic block is to be configured to store a user defined state:
setting, by the controller, an enable read flag value to indicate that a known state should be read out during a data verification and correction process; and
setting, by the controller, a mode flag value to indicate that configuration logic should be excluded from the data verification and correction process, wherein the configuration logic is operable to identify values stored in a plurality of logic elements associated with the logic block; and
in response to determining that the logic block is to be configured to store a design state:
setting, by the controller, the mode flag value to indicate that the configuration logic should be included in the data verification and correction process; and
setting, by the controller, the enable read flag value to indicate that the values stored in the configuration logic should be read out during the data verification and correction process, wherein the mode flag value or enable read flag value is implemented using at least one of triple modular redundancy, larger gate area, protective capacitors, or the use of increased voltage.

19. The method of claim 18, wherein the enable read flag value and the mode flag value are identified by an encoding scheme.

20. The method of claim 18, wherein the mode flag value or enable read flag value is positioned to reduce the time between a scan of the mode flag value or enable read flag value and a scan of the configuration logic during the data verification and correction process.

21. The method of claim 18, wherein the mode flag value or enable read flag value are implemented using triple modular redundancy.

22. The method of claim 18 further comprising setting the values stored in the configuration logic to an initialized state.

* * * * *